United States Patent
Aberg et al.

(10) Patent No.: US 8,798,971 B2
(45) Date of Patent: Aug. 5, 2014

(54) SYSTEM AND METHOD FOR USING A TRUTH TABLE GRAPHICAL FUNCTION IN A STATECHART

(75) Inventors: Robert O. Aberg, South Grafton, MA (US); Vijaya Raghavan, Framingham, MA (US); Yao Ren, Sudbury, MA (US)

(73) Assignee: The MathWorks, Inc., Natick, MA (US)

( * ) Notice: Subject to any disclaimer, the term of this patent is extended or adjusted under 35 U.S.C. 154(b) by 1314 days.

(21) Appl. No.: 10/268,541

(22) Filed: Oct. 10, 2002

(65) Prior Publication Data

US 2004/0073413 A1 Apr. 15, 2004

(51) Int. Cl.
*G06G 7/48* (2006.01)
*G06F 9/45* (2006.01)
*G06F 9/44* (2006.01)
*G06F 17/50* (2006.01)

(52) U.S. Cl.
CPC .............. *G06F 8/34* (2013.01); *G06F 17/5022* (2013.01)
USPC .................. 703/6; 703/22; 717/109; 717/105

(58) Field of Classification Search
CPC .............................. G06F 8/34; G06F 17/5022
USPC ......................................... 703/6, 22; 717/709
See application file for complete search history.

(56) References Cited

U.S. PATENT DOCUMENTS

| | | | | |
|---|---|---|---|---|
| RE33,922 E | * | 5/1992 | Kimura et al. ................. | 711/154 |
| 5,187,788 A | * | 2/1993 | Marmelstein ................. | 717/109 |
| 5,220,512 A | * | 6/1993 | Watkins et al. ................. | 716/11 |
| 5,485,600 A | * | 1/1996 | Joseph et al. ................... | 703/13 |
| 5,555,201 A | * | 9/1996 | Dangelo et al. ................ | 703/13 |
| 5,604,895 A | * | 2/1997 | Raimi .............................. | 703/13 |
| 5,652,714 A | * | 7/1997 | Peterson et al. ............... | 702/57 |
| 5,751,592 A | * | 5/1998 | Takai et al. ..................... | 716/18 |
| 5,801,958 A | * | 9/1998 | Dangelo et al. ................ | 716/18 |
| 5,903,580 A | * | 5/1999 | Honmura ........................ | 703/16 |
| 6,044,211 A | * | 3/2000 | Jain ............................... | 716/102 |
| 6,289,489 B1 | * | 9/2001 | Bold et al. ........................ | 716/1 |
| 6,717,597 B2 | * | 4/2004 | Letzelter et al. .............. | 715/810 |
| 7,076,411 B2 | * | 7/2006 | Santori et al. ..................... | 703/6 |
| 7,720,656 B2 | * | 5/2010 | Raghavan et al. ................ | 703/6 |
| 7,784,005 B1 | * | 8/2010 | Ng ................................. | 716/128 |
| 7,877,245 B1 | * | 1/2011 | Raghavan et al. ................ | 703/6 |
| 7,945,886 B2 | * | 5/2011 | Raghavan et al. ........... | 716/136 |
| 7,979,243 B1 | * | 7/2011 | Mosterman et al. .............. | 703/6 |
| 8,170,850 B1 | * | 5/2012 | Raghavan et al. ................ | 703/6 |
| 8,234,625 B2 | * | 7/2012 | Aberg .......................... | 717/109 |
| 8,364,456 B2 | * | 1/2013 | Raghavan et al. .............. | 703/22 |
| 2002/0083413 A1 | * | 6/2002 | Kodosky et al. .............. | 717/109 |

(Continued)

OTHER PUBLICATIONS

Automated code generation from graphical, reusable templates Dellen, C.; Liebner, G.; Digital Avionics Systems Conference, 1991. Proceedings., IEEE/AIAA 10th Oct. 14-17, 1991 pp. 290-304.*

(Continued)

*Primary Examiner* — Akash Saxena
(74) *Attorney, Agent, or Firm* — Cesari and McKenna, LLP; Michael R. Reinemann (57) ABSTRACT

A method of specifying a truth table includes generating a block diagram model, generating a statechart in the block diagram model, selecting a truth table graphical function in the statechart, and applying a set of graphical semantics for logic specification to the truth table graphical function combined with textual language predicates and actions.

10 Claims, 10 Drawing Sheets

(56) References Cited

U.S. PATENT DOCUMENTS

2004/0225967 A1* 11/2004 Hassanin et al. ............... 715/760
2006/0235548 A1* 10/2006 Gaudette ......................... 700/83
2007/0130530 A1* 6/2007 Anderson et al. ............. 717/105

OTHER PUBLICATIONS

Automated validation of software models Sims, S.; Cleaveland, R.; Butts, K.; Ranville, S.; Automated Software Engineering, 2001. (ASE 2001). Proceedings. 16th Annual International Conference on Nov. 26-29, 2001 pp. 91-96.*
Computer aids for teaching logic design Roth, C.H.; Frontiers in Education Conference, 1993. Twenty-Third Annual Conference. 'Engineering Education: Renewing America's Technology', Proceedings. Nov. 6-9, 1993 pp. 188-191.*
An interactive tool for design, simulation, verification, and synthesis of protocols Chao, D.Y.; Wang, D.T.; Modeling, Analysis, and Simulation of Computer and Telecommunication Systems, 1994., MASCOTS '94., Jan. 31-Feb. 2, 1994 pp. 381-385.*
Symbolic verification of executable control specifications Banphawatthanarak, C.; Krogh, B.H.; Butts, K.; Computer Aided Control System Design, 1999. Proceedings of the 1999 IEEE International Symposium on Aug. 22-27, 1999 pp. 581-586.*
An expert system for Karnaugh map minimization Lee, E.T.; Industrial Electronics, Control and Instrumentation, 1991. Proceedings. IECON'91., 1991 International Conference on Oct. 28-Nov. 1, 1991 pp. 1517-1520.*
HAL: A block level HArdware Logic simulator Tohru Sasaki, Nobuhiko Koike, Kenji Ohmori, Kyoji Tomita Jun. 1983 Proceedings of the 20th conference on Design automation.*
Symbolic model checking for sequential circuit verification Burch, J.R. et al; Computer-Aided Design of Integrated Circuits and Systems, IEEE Transactions on vol. 13, Issue 4, Apr. 1994 pp. 401-424.*
Comments on modified condition/decision coverage for software testing [of flight control software] White, A.L.; Aerospace Conference, 2001, IEEE Proceedings. vol. 6, Mar. 10-17, 2001 pp. 2821-2827 vol. 6.*
Verification of Stateflow Diagrams Using SMV: sf2smv 2.0" Chonlawit BanPhawatthanarak et al; http://www.ece.cmu.edu/~webk/sf2smv/Documentation/SF2SMVv1_0.pdf.*
"Introduction to Digital Logic Design" Hayes, John P., ISBN0-201-15461-7 Printed May 1994, p. 420-422.*
Matrixx's "Getting Started Guide Version 7.1" (Matrixx hereafter—dated Nov. 16, 2000, PDF document pp. 1-176).*
Matrixx's "Better State Getting Started Version 6.0" pp. 1-66, Nov. 30, 2000.*
Matrixx's "State Transition Diagram (STD) blocks User's Guide" pp. 1-21, May 2003.*
SB2SL Model-Based and System-Based Design User's Guide Version 2, pp. 1-26, Dated Oct. 2004 with version history on p. 2 dating to Oct. 1998.*
Automated code generation from graphical, reusable templates Dellen, C.; Liebner, G.; Digital Avionics Systems Conference, 1991 Proceedings., IEEE/AIAA 10th Oct. 14-17, 1991 pp. 299-304; Provided on IDS dated Dec. 2, 2005.*
Matlab Release 11 New features; pp. 1-226; Jan. 1999.*
Masahiko Watanabe, Extended Hierarchy State Transition Matrix Design Method Version 2.0, CATS 1997.
Stephen D. Morton, Applied Dynamics International, "Defining a "Safe Code" Development Process", Jan. 4, 2001, pp. 1-7.
BEACON, Applied Dynamics International, 2002.

* cited by examiner

| ☐ Stateflow(truth table) sensor_check/Choose sensor value. | | | | | | | | |
|---|---|---|---|---|---|---|---|---|
| File Edit Tools Help Diagnostics | | | | | | | | |

252

Condition Table:

| | Description | Condition | D1 | D2 | D3 | D4 | D5 | D6 |
|---|---|---|---|---|---|---|---|---|
| 1 | Use value from network link | use_link_values | T | F | F | F | F | -- |
| 2 | Sensor 1 broken | isnan(sensor1) | -- | -- | F | T | F | T | -- |
| 3 | Sensor 2 broken | isnan(sensor2) | -- | F | F | T | T | -- |
| 4 | If the system is off, the sensors time out, need to use default value. | ▲ system_ON ▼ Actions | T | T | T | T | T | -- |
| | | | 1,5 | 2 | 3 | 4 | 5,6 | 6 |

254

Action Table:

| | Description | Action |
|---|---|---|
| 1 | Use value from air data computer | sensed_value = ADC_sensed_value ; |
| 2 | Average the sensed values | sensed_value = [sensor1 + sensor2] / 2;<br>sensor_failure_level = 0 ; |
| 3 | sensor2 is good | sensed_value = sensor2 ;<br>sensor_failure_level = 1 ; |
| 4 | sensor1 is good | sensed_value = sensor1 ;<br>sensor_failure_level = 2 ; |
| 5 | No value available from this unit. | sensor_failure_level = 3 ; |
| 6 | Signal is not used | sensed_value = SENSED_MIN ; |

*FIG. 8*

| / Exploring - sensor_check/Choose sensor value | | | | | | | | _ □ × |
|---|---|---|---|---|---|---|---|---|
| File  Edit  Tools  Add  Help | | | | | | | | |
| Object Hierarchy | Contents of: (chart) sensor_check/Choose sensor value | | | | | | | |
| -□ sensor_check | Name | Scope | Trigger | Type | Size | Min | Max | InitVal  FrV |
| ┌ [Choose sensor value] | □ sensor1 | Input(1) | | double | | | | ⎫ |
| └ f() ? | □ sensor2 | Input(2) | | double | | | | ⎪ |
| | □ ADC_sensed_value | Input(3) | | double | | | | ⎪ |
| | □ system_ON | Input(4) | | double | | | | ⎬ 302 |
| | □ use_link_values | Input(5) | | double | | | | ⎪ |
| | □ sensed_value | Output(1) | | double | | | 0 | ⎪ |
| | □ sensor_failure_level | Output(2) | | double | | | 0 | ⎪ |
| | □ SENSED_MIN | Constant | | double | | | 0.05 | ⎭ |
| events (0) data (8) targets (0)  8  [1:8] | | | | | | | | |

FIG. 9

*/ Stateflow(truth table) sensor_check/Choose sensor value.

File  Edit  Tools  Help  Diagnostics

Condition Table:

|   | Description | Condition | D1 | D2 | D3 | D4 | D5 | D6 |
|---|---|---|---|---|---|---|---|---|
| 1 | Use value from network link | use_link_values | T | F | F | F | F | -- |
| 2 | Sensor 1 broken | isnan(sensor1) | -- | F | T | F | T | -- |
| 3 | Sensor 2 broken | isnan(sensor2) | -- | F | F | T | T | -- |
| 4 | If the system is off, the sensors time out, need to use default value. | system_ON | T | T | T | T | T | -- |
|   |  | Actions | 1,5 | 2 | 3 | 4 | 5,6 | 6 |

Action Table:

|   | Description | Action |
|---|---|---|
| 1 | Use value from air data computer | sensed_value = ADC_sensed_value ; |
| 2 | Average the sensed values | sensed_value = [sensor1 + sensor2] / 2; sensor_failure_level = 0 ; |
| 3 | sensor2 is good | sensed_value = sensor2 ; sensor_failure_level = 1 ; |
| 4 | sensor1 is good | sensed_value = sensor1 ; sensor_failure_level = 2 ; |
| 5 | No value available from this unit. | sensor_failure_level = 3 ; |
| 6 | Signal is not used | sensed_value = SENSED_MIN ; |

Stateflow(truth table) sensor_check/Choose sensor value.

File Edit Tools Help Diagnostics

Condition Table: *454*

| | Description | Condition | D1 | D2 | D3 | D4 | D5 | D6 |
|---|---|---|---|---|---|---|---|---|
| 1 | Use value from network link | use_link_values | T | F | F | F | F | -- |
| 2 | Sensor 1 broken | isnan(sensor1) | -- | F | T | F | T | -- |
| 3 | Sensor 2 broken | isnan(sensor2) | -- | F | F | T | T | -- |
| 4 | If the system is off, the sensors time out, need to use default value. | system_ON | T | T | T | T | T | -- |
| | | Actions | 1,5 | 2 | 3 | 4 | 5,6 | 6 |

460 — row 1
458 — row 2
456 — row 3
462 — row 4
452 — isnan(sensor1)

Action Table:

| | Description | Action |
|---|---|---|
| 1 | Use value from air data computer | sensed_value = ADC_sensed_value ; |
| 2 | Average the sensed values | sensed_value = [sensor1 + sensor2] / 2; sensor_failure_level = 0 ; |
| 3 | sensor2 is good | sensed_value = sensor2 ; sensor_failure_level = 1 ; |
| 4 | sensor1 is good | sensed_value = sensor1 ; sensor_failure_level = 2 ; |
| 5 | No value available from this unit. | sensor_failure_level = 3 ; |
| 6 | Signal is not used | sensed_value = SENSED_MIN ; |

464 — row 1
466 — row 2

*FIG. 11*

SYSTEM AND METHOD FOR USING A TRUTH TABLE GRAPHICAL FUNCTION IN A STATECHART

FIELD OF THE INVENTION

The present invention relates to truth tables.

BACKGROUND

A finite state machine (FSM) is a presentation of an event-driven (i.e., reactive) system. In an event-driven system, the system makes a transition from one state (also referred to as "mode") to another, prescribed state, provided that the condition defining a change is true. For example, a FSM may be used to represent a vehicle's automatic transmission. The automatic transmission has a number of operating states, such as park, neutral, drive and reverse. The automatic transmission makes a transition from one state to another when an operator shifts from one position to another, for example, from park to neutral.

Designers often use truth tables to represent relationships among inputs, outputs and states of a FSM. The resulting truth table describes logic necessary to control the behavior of the system under study.

Statechart systems for modeling FSMs permit a user to embed textual definitions of functions in a statechart and invoke those functions in the statechart. In a textually defined function, the procedure performed by the function is defined by code.

SUMMARY

In an aspect, the invention features a method of specifying a truth table including generating a block diagram model, generating a statechart in the block diagram model, selecting a truth table graphical function in the statechart, and applying a set of graphical semantics for logic specification to the truth table graphical function combined with textual language predicates and actions.

Embodiments may include one or more of the following. Selecting the truth table graphical function may include invoking the function graphically in accordance with semantics of the statechart's programming language and/or invoking the function symbolically in accordance with semantics of the statechart's programming language.

Applying may include adding conditions to the truth table graphical function, adding decision sets to the truth table graphical function, adding action codes in a last row of the conditions, and adding actions with descriptions in a selected programming language. Adding conditions may include by adding rows and be in response to a user selecting a toolbar button on a graphical user interface, in response to a user selecting a menu item on a graphical user interface, in response to a user performing a keyboard command, and/or under scripted control, and/or in response to a user selecting a context menu.

The method may also include propagating properties such as data types and sample times of the block diagram model to data types of the selected programming language and sample times of the truth table's parent chart, generating programming code for the truth table graphical function, generating a flow visualization of the truth table graphical diction, and/or generating a coverage report for the truth table graphical function. The coverage report may include a reachability analysis, results data, and missed cases through logic reduction, or exhaustive search.

The method may also include highlighting of active elements of the truth table graphical function during a block diagram model simulation or while connected to a remotely executing copy of the code generated from the truth table.

In another aspect, the invention features a method including in a computer system, generating a block diagram model, generating a statechart in the block diagram model, selecting a truth table graphical function in the statechart, applying a set of graphical semantics for logic specification to the truth table graphical function combined with textual language predicates and actions, and graphically debugging the truth table graphical function.

Embodiments may include one or more of the following. Applying may include adding conditions to the truth table graphical function, adding decision sets to the truth table graphical function, adding action codes in a last row of the conditions, and adding actions with descriptions in a selected programming language. Applying may also include deleting the conditions, decision sets, action codes and actions from the truth table graphical function.

Graphically debugging may include dynamically highlighting active elements of the truth table graphical function during execution and may include graphically setting breakpoints on conditions, graphically setting breakpoints on decision sets, graphically setting breakpoints on actions, and/or inspecting variables representing elements of the truth table graphical function while single stepping.

In another aspect, the invention features an interface including a workspace, a set of graphical semantics for generating a block diagram model, a set of graphical semantics for generating a statechart in the block diagram model, and a set of graphical semantics for logic specification of a truth table function combined with textual language predicates and actions.

Embodiments may include one or more of the following. The interface may include a graphical semantic for invoking block diagram model functions through an action language invocation of other graphical functions and/or a debugging graphical user interface.

Other features, objects, and advantages of the invention will be apparent from the description and drawings, and from the claims.

DETAILED DESCRIPTION

Figure 1:
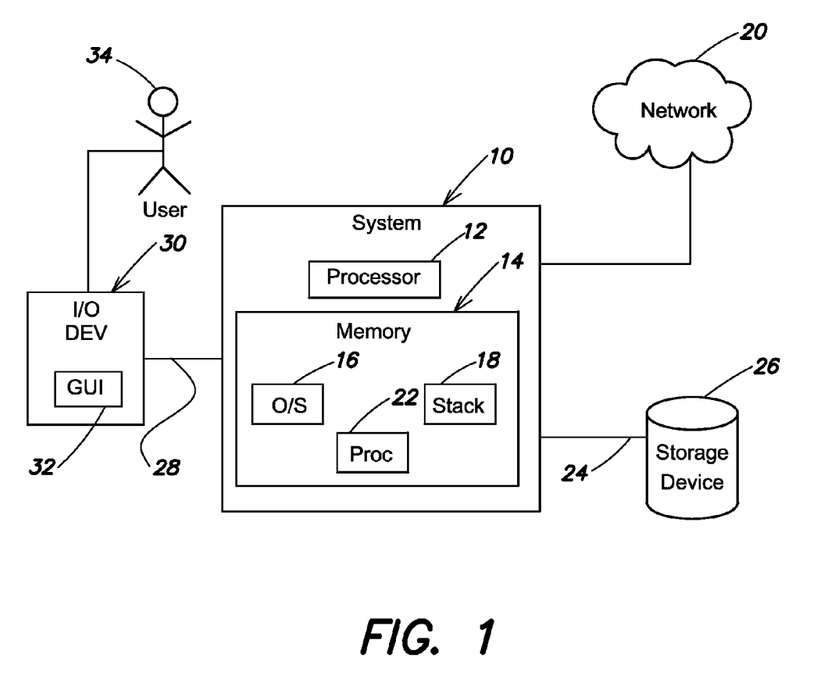
FIG. 1 is a block diagram of a system.

Referring to FIG. 1, a system 10 includes a processor 12 and a memory 14. Memory 14 includes an operating system (O/S) 16, such as Windows® or Linux, a stack 18 for communicating with a network 20, and a process 22 that when executed by the processor 12 performs a statechart process. The system 10 also includes a link 24 to a storage device 26 and a link 28 to an input/output (I/O) device 30. The I/O device 30 displays a graphical user interface (GUI) 32 to a user 34.

Graphical functions within the process 22 allow the user 34 to use a diagram to visually represent a procedure performed by a function in the process 22. An example statechart process 22 is Stateflow® from The Mathworks, Inc. of Natick, Mass., incorporated by reference herein. Truth tables implement logical decisions and actions that the user 34 specifies in a textual truth table form. The user 34 can generate any function in Stateflow® with graphical functions using a flow graph notation. However, truth tables give the user 34 the convenience of specifying functions with specified logical behavior without having to draw flow graphs.

Figure 2:
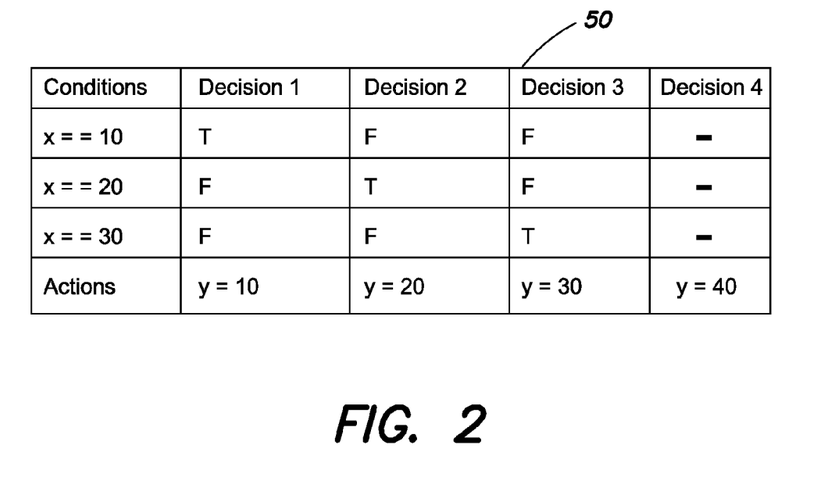
FIG. 2 is an exemplary truth table.

Referring to FIG. 2, an exemplary truth table 50 includes conditions, condition outcomes, decision outcomes and actions. The process 22 evaluates the truth table 50 with certain rules. For example, the conditions entered in the truth table 50 "Conditions" column evaluate to a value of true (non-zero) or false (zero). Each condition is assumed to be independent of each other, i.e., no analysis is performed to determine if one condition depends on another condition. Possible values for each condition are referred to as condition outcomes and can be true (T), false (F), or true or false (–).

A decision outcome is a decision column with a particular combination of condition outcomes for each condition, linked by a logical AND condition. For example, one can express the Decision 1 column of table 50 in pseudocode as:

if($(x==10)$&!$(x==20)$&!$(x==30)$)

Each decision outcome column has a single action specified for it at the bottom of its column. Multiple actions are permitted, specified as a comma separated list and executed in the order of the list. For example, the action specified for Decision 1 in table 50 is y=10. This means that Decision 1 and its action can be expressed as follows in pseudocode:

if($(x==10)$&!$(x==20)$&!$(x==30)$) $y=10$;

Decision outcomes are tested in left to right column order. If a decision outcome is tested as true, its assigned action is immediately executed and the truth table 50 is exited. The order of testing for individual condition outcomes for a decision outcome is undefined.

The user 34 can enter a default decision outcome covering all possible decision outcomes as the last (i.e., rightmost) decision outcome in a table.

Using the above rules, the example truth table 50 can be realized with the following pseudocode:

if($(x==10)$&!$(x==20)$&!$(x==30)$) $y=10$;

else if(!$(x==10)$&$(x==20)$&!$(x==30)$) $y=20$;

else if(!$(x==10)$&!$(x==20)$&$(x==30)$) $y=30$;

else $y=40$;

endif;

Edit-time inputs to the truth table 50 are data definitions, Boolean condition expressions (in a textual or graphical language), textual or graphical description for each condition, a logic table and actions that are mapped to action codes. The condition expressions and actions are generated in a textual or graphical action language. The action language supports fixed-point data operations and/or matrix data operations. The action language also supports frame and complex (real, imaginary) data operations. An example of an action language supporting complex and frame operations on data is the Simulink® block diagram language from The Mathworks, Inc., incorporated by reference herein.

Implied inputs to the truth table 50 can include specification of data type, data dimensions, data complexity, and data frame-ness for data used in the truth table 50.

In an example, all inputs have the same data type and all local and output variables are instantiated using the same data type. If all inputs are single precision floating point, a data type propagation rule is to instantiate all local and output variables as single precision also.

For dimension propagation through the variables of a truth table supporting a matrix action language, if the inputs are various matrices of fixed dimensions, then the operations performed on these matrices determine the output dimensions.

Run-time inputs to the truth table are symbols such as variables of any data type needed by a data dictionary.

A data dictionary is a collection of specification for data objects or items in a data model for use by the simulation and code generation algorithms to use in setting predefined data types, storage class, and any other information needed to allocate, declare, and refer to the data in the simulation or the generated code. A first step in analyzing a system of objects with which users interact is to identify each object and its relationship to other objects. This process is called data modeling and results in a picture of object relationships. After each data object or item is given a descriptive name, its relationship is described (or it becomes part of a data structure that implicitly describes relationship), the type of data (such as text or image or binary value) is described, possible predefined values are listed, and a brief textual description is provided. This collection can be organized for reference into a data structure called a data dictionary that is used by the simulation and code generation code to allocate, declare, and reference data elements.

With TMW truth tables, data can come from inputs from Simulink® block diagrams, outputs from other Stateflow® chart data that are in scope for the truth table are accessible, as are any other in-scope data in the data dictionary. A TMW truth table refers to the truth table, coupled with the predicate expressions (i.e., conditions), coupled with the actions.

Figure 3:
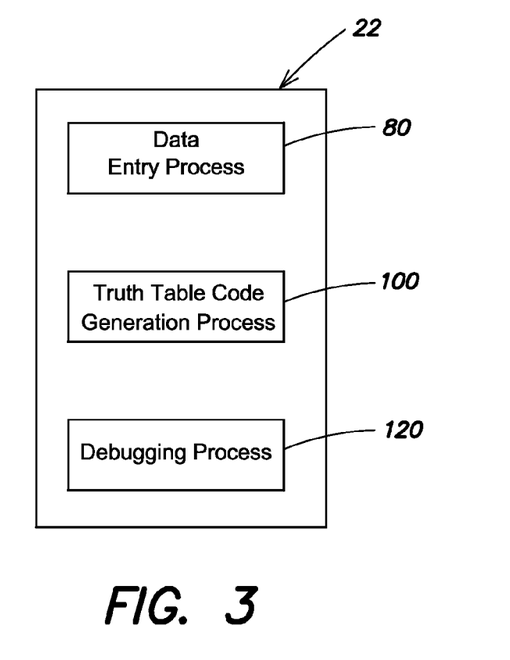
FIG. 3 is a flow diagram.

Referring to FIG. 3, the statechart process 22 includes a data entry process 80, a truth table code generation process 100 and a debugging process 120. Although the statechart process 22 is explained using Simulink® and Stateflow®, any suitable block diagram modeling process and statechart process using an interactive design tool for modeling and simulating event-driven systems may be used.

Figure 4:
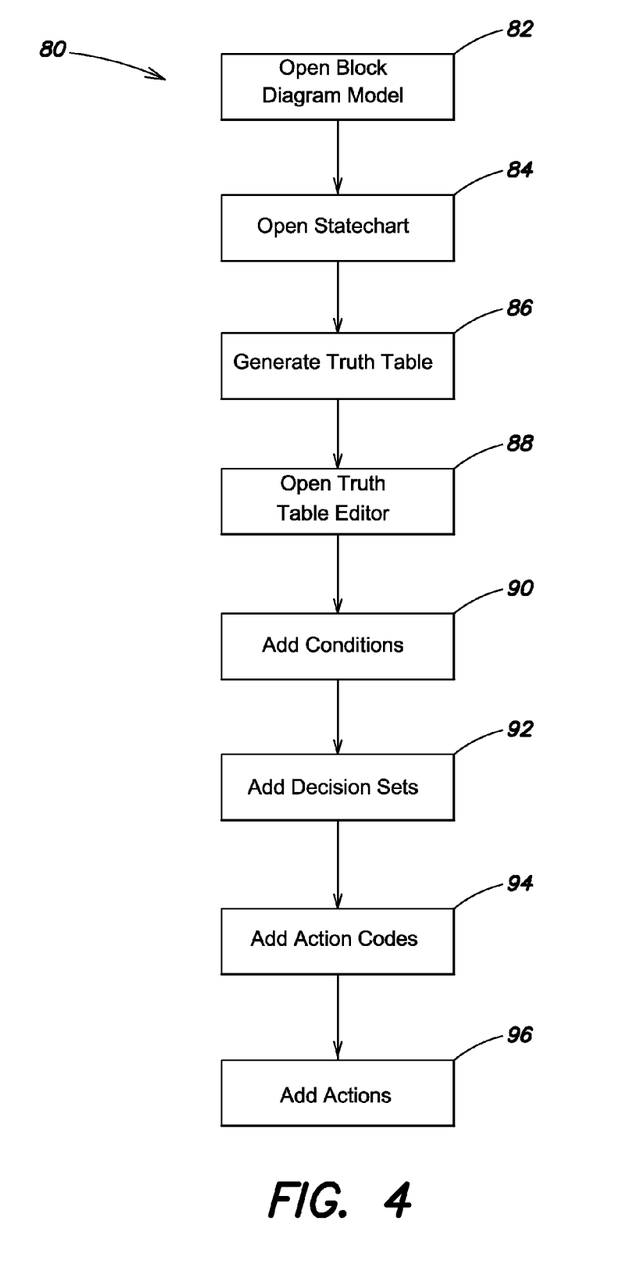
FIG. 4 is a flow diagram.

Referring to FIG. 4, the data entry process 80 includes opening (82) a Simulink® model in the GUI 32 and opening (84) a Stateflow® chart in the Simulink® model. The process 80 generates (86) a truth table in the Stateflow® chart in response to the user 34 dragging down a state via a context menu, changing it to type "truth table" and a default transition in the chart is generated and the truth table is made to be invoked on the default transition. The process 80 opens (88) a truth table editor in response to the user 34 double clicking on a truth table block. The process 80 adds (90) conditions specified by the user 34 by adding rows (toolbar button, menu item, keyboard command, or context menu) and typing, for example, in a textual action language. The process 80 adds (92) decision sets (D1, D2, . . . ) and the "true," "false," and "don't care" (true or false) entries (that in other examples can be 1/0/*, Y/N/X, or other combinations of three unique symbols). The process 80 adds (94) action codes in the last row of the condition table (or column, if the table is presented in a transposed fashion). The process 80 adds (96) actions along with descriptions in the action table. The actions are added (96) in the action language specified for the truth table. In this example it is the Stateflow® action language. In other examples the action language can be Simulink® or Stateflow® graphical items, for example.

The statechart process 22 interprets the truth table as follows. All inputs are stored as entered. The condition and action text descriptions can be either ignored or placed in generated code or used in printouts. To interpret the table's conditions, logic table, and actions, the following occurs:

First, starting with the first decision set in the logic table, conditions with "T" or "F" entries are evaluated starting from the first condition from the top of the first column of the table that is a "T" or a "F" and proceeding downward. "T" conditions are used as evaluated, "F" entries are give a logical NOT operation. After all entries in the decision set with a "T" or "F" are evaluated ("don't care" items are ignored), the condition results are ANDed together. For example if there are four conditions A, B, C, and D and the decision set is "T," then "–," "F," "T" down the column (T,F,T), then the combination of decision set and condition evaluations are interpreted as (A && !C && D), using a C programming language syntax. The computation (A && !C && D) is called a decision result.

Second, if the decision result for a decision set evaluated does not evaluate to true (i.e., (A && !C && D) was false), then proceed to the next decision set (column).

Third, repeat the above until a decision result is true. For the first decision result found true, execute the action(s) listed in the order given for the corresponding decision set. An action code input of 1,6,2 means execute action 1 then 6 then 2, then leave the truth table. The last decision set in the table (far right) is permitted to be all "don't care" ('–') entries indicating a default case.

Other interpretations are possible. For example, expansion of the "don't care" items and reordering from FFFF . . . to TTTT . . . to correspond to an indexed table look-up at runtime or use of "if-then-else" constructs from equivalent logic.

Figure 5:
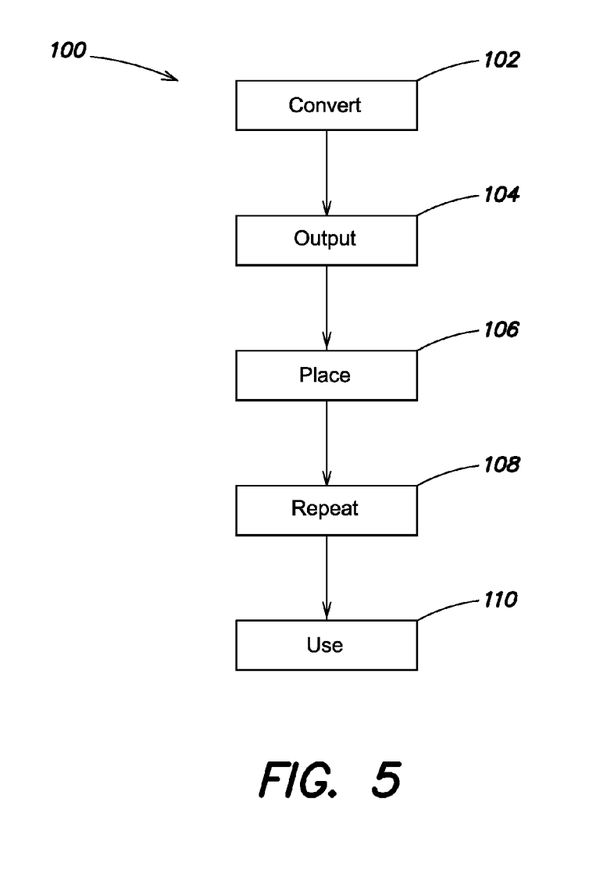
FIG. 5 is a flow diagram.

Referring to FIG. 5, the truth table code generation process 100, using a C programming language example, includes converting (102) each condition expression into C programming language code. For the first decision set, the process 100 outputs (104) an "if(*){" line, where "*" is formed by putting each condition with an "F" or "T" entry in parenthesis in decision set row order and putting a NOT operation around the "F" entries. For the example shown in FIG. 2 with four condition expressions A, B, C, and D with decision set value T,F,T, the code generated is as follows:

if((A)&&!(C)&&(D){

Note that the "–" value for B means don't care, so it is not checked. The process 100 places (106) the actions from first to last after the if statement (or alternatively makes each action a graphical function and invokes the correct graphical function inside the if body).

The process 100 repeats (108) outputting 104 and replacing 106 for each decision set from left to right in the logic table, but uses "}else if(*) {" instead of "if(*) {".

If the last decision set is all "don't care" ('–') entries, the process 100 uses (110) "} else {".Finish the code fragment with}.

In an example, the process 100 is described in the context of Stateflow® as follows. In the Stateflow® implementation of process 100 for truth tables, the truth table entries are converted into an equivalent flow diagram having the same semantics as the C code generation example above. This is done as follows:

Each condition is placed as the transition (line) code from one node to another starting with a default transition at the beginning of the flow graph. This is done so that all conditions are evaluated and assigned to temporary variables in their row order. A variant option allows the latest possible evaluation of the value just before it is used to improve typical latency in simulating or executing the code.

Flow graph nodes and if-then events are added to the flow graph using a Stateflow® command API. "if-then" is constructed on transitions between two nodes using conditionals in square brackets in accordance with the Stateflow® action language notation of using square brackets to denote "move along this line if the expression in brackets is true", or "[(c1) && !(c3) && (c4)]" is placed on a line as a conditional transition.

Another, empty, line is added to a another new node that leaves each previously added node that denotes the path to take if the decision result "[(c1) && !(c3) && (c4)]" is false. The new node is used as the basis for repeating flow graph nodes. All decision results are calculated by adding conditional transitions between nodes in decision set (column) execution order. The resulting flow graph is also highlighted during execution if visible and the highlighting option is active (on). This is useful in that it helps to visualize the design of the truth table during simulation and debugging. During code generation 100, variables in the data dictionary are declared and initialized per the specification in the data dictionary.

Coverage analysis of truth tables is now described in an example.

Reachability: in one strategy, every combination of condition result to the logic table is created and the decision set reached is recorded in a list of all possible condition results. Other strategies are possible; an important result is that after running a reachability analysis, decision sets are known to either be reachable by at least one set of condition outputs or not at all. Similarly, after tallying all the executed decision sets, the action codes are marked as to if they are reachable or not. Performing a logic reduction technique such as Quine-McCluskey on the original set of unreachable cases and then reporting the compact version can more succinctly report the set of unreachable input condition sets. Quine-McCluskey optimization is useful and often used in the field of digital electronics where there is sometimes a strong preference for using the truth table of a proposition instead of the proposition itself.

For example, with ten conditions, a logic table has $2^{10}=1024$ possible input condition sets. If there is a case that one condition result is never false, then 512 inputs are unreachable. Instead of reporting the 512 missing cases, using logic reduction can report that this variable is never false with one condition set.

Coverage data collection: test sequences or test vectors are run on the truth table in Simulation and/or generated C programming code and data is collected on which columns are reached.

Coverage analysis: coverage data collection to reachability analysis results is compared. The coverage data is considered to be complete if all the reachable decision sets were reached. It is an error condition if any of the unreachable decision sets or actions were reached. This is valuable in addition to the basic idea of coverage, for it shows error conditions and the completeness of the test vector as well as the detection of unreachable code.

Coverage data collection practicality: it can be practical to perform an exhaustive reachability analysis and impractical to run a coverage test that sets all the conditions true and false. So, if a coverage data collection is performed that uses an algorithm different from the reachability analysis (e.g., an optimal minimum set of test sequences), it is not always the case that the coverage data collection uses the same technique as the reachability analysis.

Figure 6:
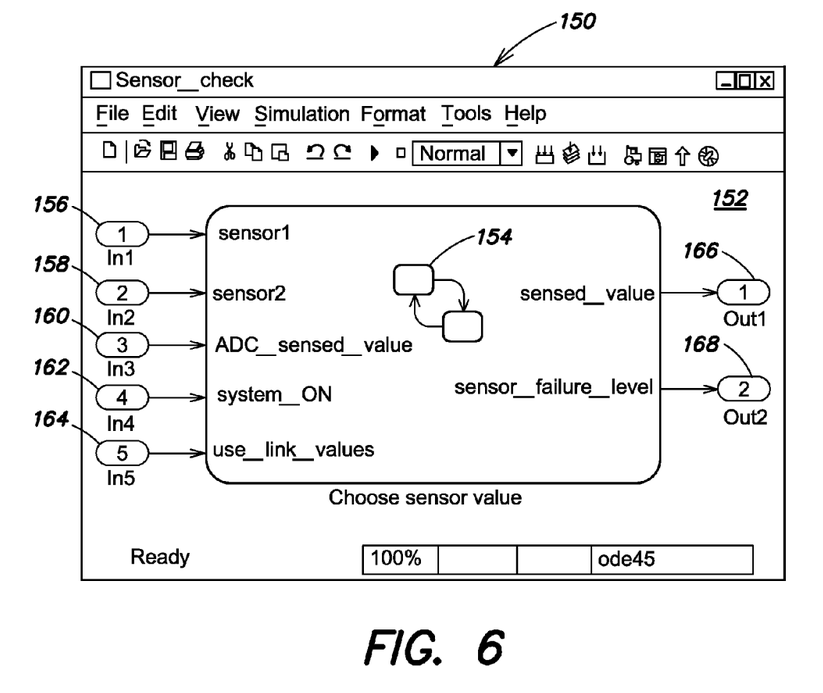
FIG. 6 is a graphical user interface (GUI) of a top level Simulink® diagram.

Referring to FIG. 6, a graphical user interface (GUI) 150 is shown. The GUI 150 represents a model 152 that includes a Stateflow® chart 154, input ports 156, 158, 160, 162, 164, and output ports 166,168. The model 152 can contain any type of Simulink® block. These Simulink® blocks can interact with Stateflow® charts in many ways. In this example, the Simulink® model 152 invokes the Stateflow® chart 154 once per time step. In general, if the user 34 only wants to specify a Stateflow® chart and generate code for the Stateflow® chart they only need to interact with Simulink®.

Figure 7:
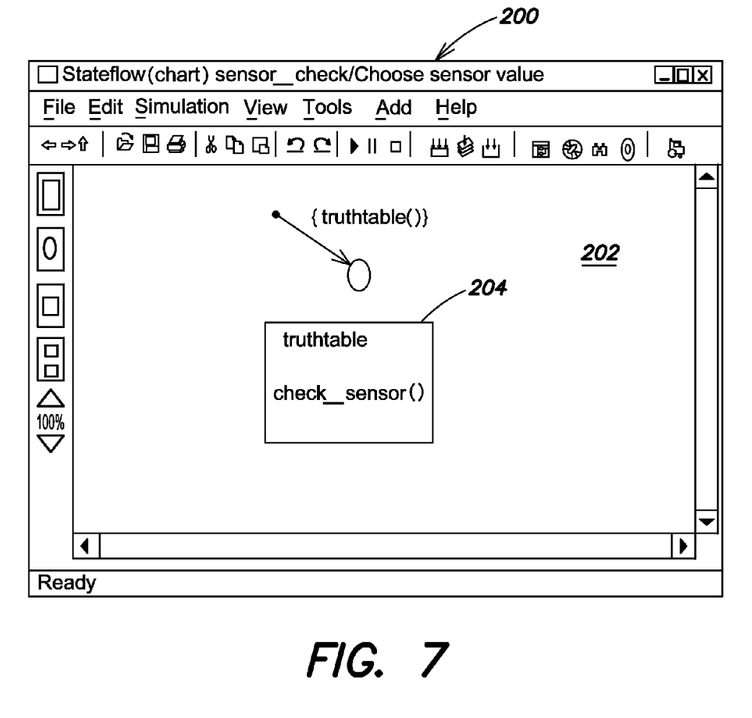
FIG. 7 is a GUI of a Stateflow® chart containing a graphical function.

Referring to FIG. 7, a GUI 200 includes a Stateflow® chart 202 containing a graphical function named truth table 204. Naming the truth table 204 is done using any valid symbol name in the graphical environment. No "wires" are required to be connected to the graphical function 204 in order to invoke it. This means that the user 34 has a textual invocation of a truth table.

Figure 8:
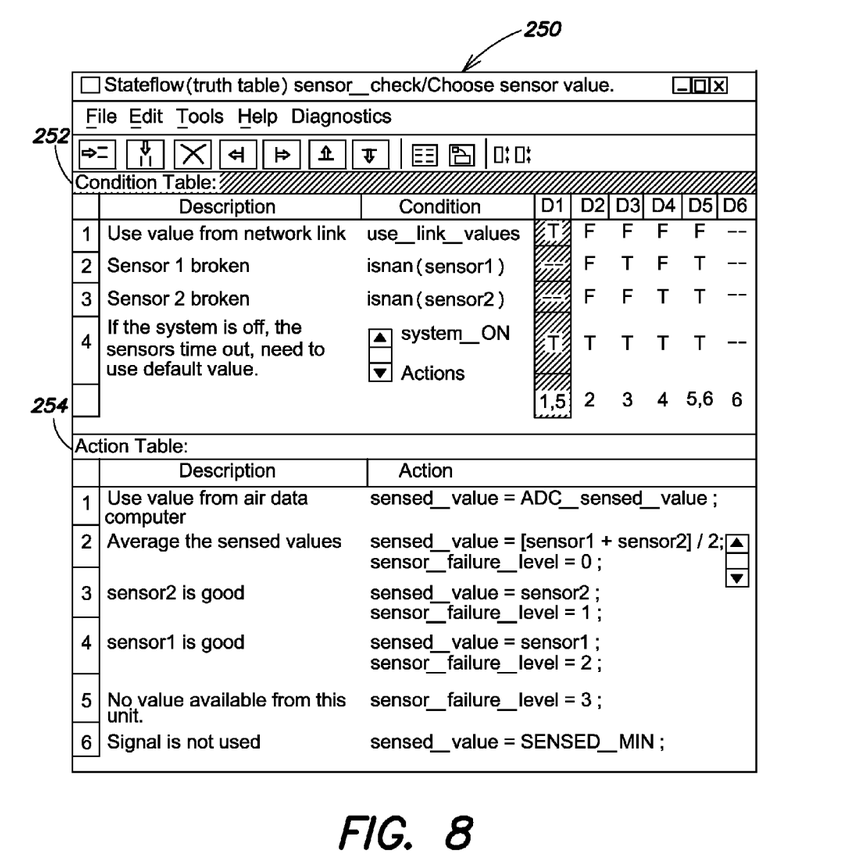
FIG. 8 is a GUI of a truth table editor.

Referring to FIG. 8, a GUI 250 illustrates a TMW truth table editor invoked by the user 32 doubling clicking on the truth table 204 graphical function of FIG. 7. Each row of the condition table 252 (except the bottom row for action codes) corresponds to a logical predicate or condition, defined in column 2. The condition column is one place that the inputs to the truth table can be used, the other place being in the action table 254. The remainder of the condition table 252 (column 3 to last including rows 1 up to but not including the last) includes columns of decision sets called the logic tables, corresponding to the rows to the input side of a text truth table. Column D1 is highlighted in the figure because it is selected by a mouse action (D1 header area was clicked with the left mouse) or by user-written program control.

The bottom row of the condition table 252 is used to specify a mapping from decision sets to actions in the action table 254. This corresponds to the output side of the rows of a text truth table that only contains value assignments.

The action table 254 rows are numbered 1 . . . n and are referred to by the action codes indicated in the bottom row of the condition table 252. In addition to using numbers, one can define and use other action codes, such as text labels or bitmap icons. An important notion is that all the action codes in the action table 254 are not duplicated and that the last row of the condition table 252 only references defined action codes. The entry for the action code in the condition table 252 can refer to multiple actions, executed in the sequence indicated. This is the case for decision sets D1 and D5.

Figure 9:
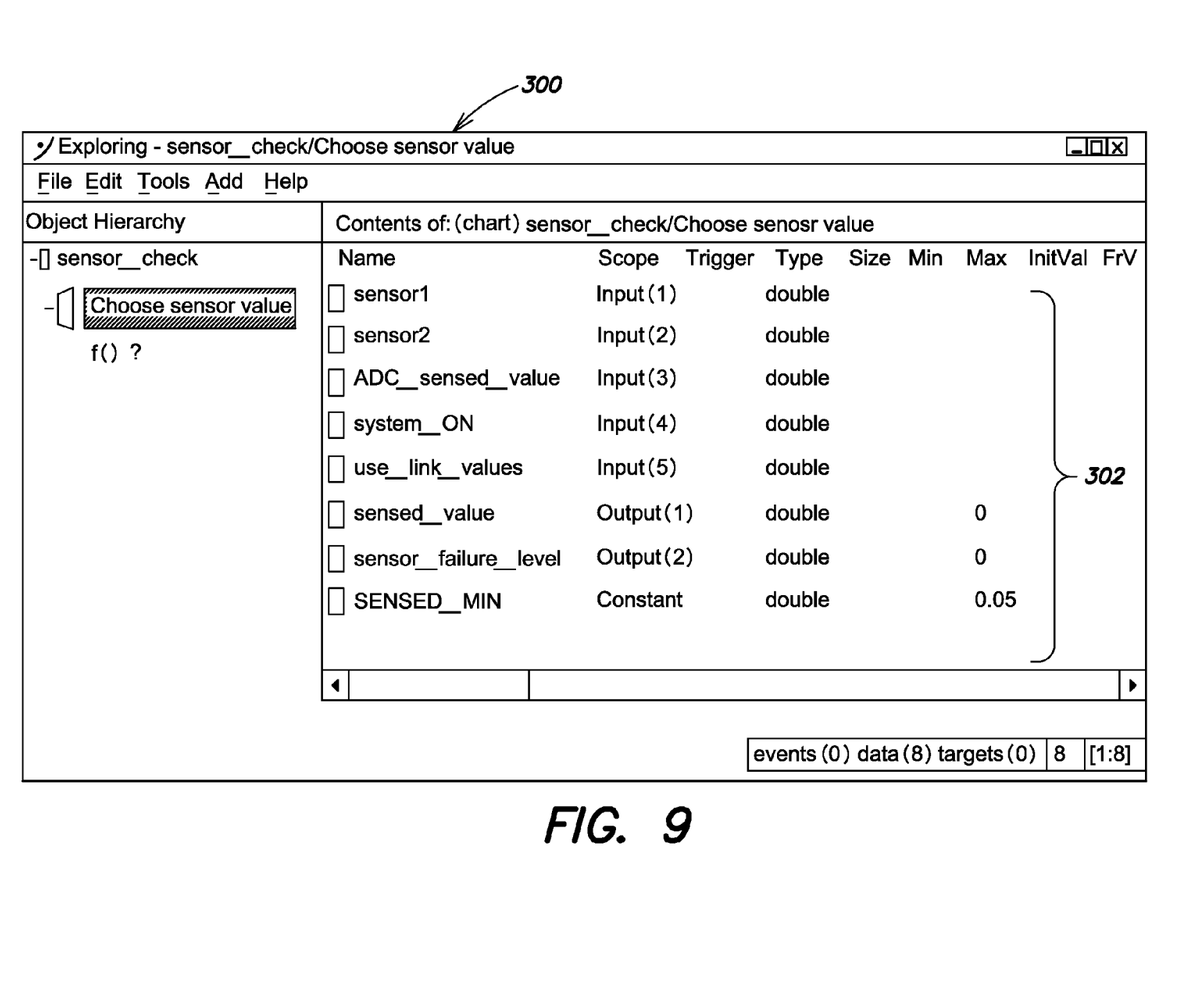
FIG. 9 is a GUI illustrating a data dictionary.

Referring to FIG. 9, a GUI 300 illustrates a data dictionary 302 containing the definitions for a truth table data using a Stateflow® editor 250. Specification of the variables used by the truth table conditions and actions is done outside of the table editor GUI 250. In an example, the data dictionary is a Stateflow® data dictionary. In other examples, the data dictionary can be any data dictionary or data structure containing data or variable specification, properties, and/or attributes.

Information for table entries in a truth table are typically stored into two cell arrays, e.g., MATLAB® cell arrays, in the Stateflow® hierarchy just as it was entered. One data array is for the condition table 252 (of FIG. 8), the other for the action table 254 (of FIG. 8). The data for truth table of FIG. 8 is shown below:

Condition table 252:

| Condition table 252: | | | | | |
|---|---|---|---|---|---|
| Columns 1 through 6 | | | | | |
| [1x27 char] | 'use_link_values' | 'T' | 'F' | 'F' | 'F' |
| 'Sensor 1 broken' | 'isnan(sensor1)' | '—' | 'F' | 'T' | 'F' |
| 'Sensor 2 broken' | isnan(sensor2) | '—' | 'F' | 'F' | 'T' |
| [1x70 char] | 'system_ON' | 'T' | 'T' | 'T' | 'T' |
| ' ' | ' Actions' | '1.5' | '2' | '3' | '4' |
| Columns 7 through 8 | | | | | |
| 'F' | '—' | | | | |
| 'T' | '—' | | | | |
| 'T' | '—' | | | | |
| 'T' | '—' | | | | |
| '5,6' | '6' | | | | |

Action table 254:

>> actionTable
ans=

| | |
|---|---|
| [1x32 char] | [1x32 char] |
| [1x25 char] | [1x65 char] |
| 'sensor2 is good' | [1x49 char] |
| 'sensor1 is good' | [1x49 char] |
| [1x34 char] | [1x25 char] |
| 'Signal is not used' | [1x26 char] |

For example, the action language entry for action 2 is:
>>actionTable (2,21)
ans=
sensed_value=(sensor 1+sensor2)/2;
sensor_failure_level=0;

A MATLAB® cell array is an array container for any data type and can thus hold data for graphical action languages as well, but there are other methods available such as storing pointers to data structures in the C language or handles to the root of the graphical instances for each graphical condition or action, if supported. The information for variables is stored in an existing format of the Stateflow® data dictionary.

Figure 10:
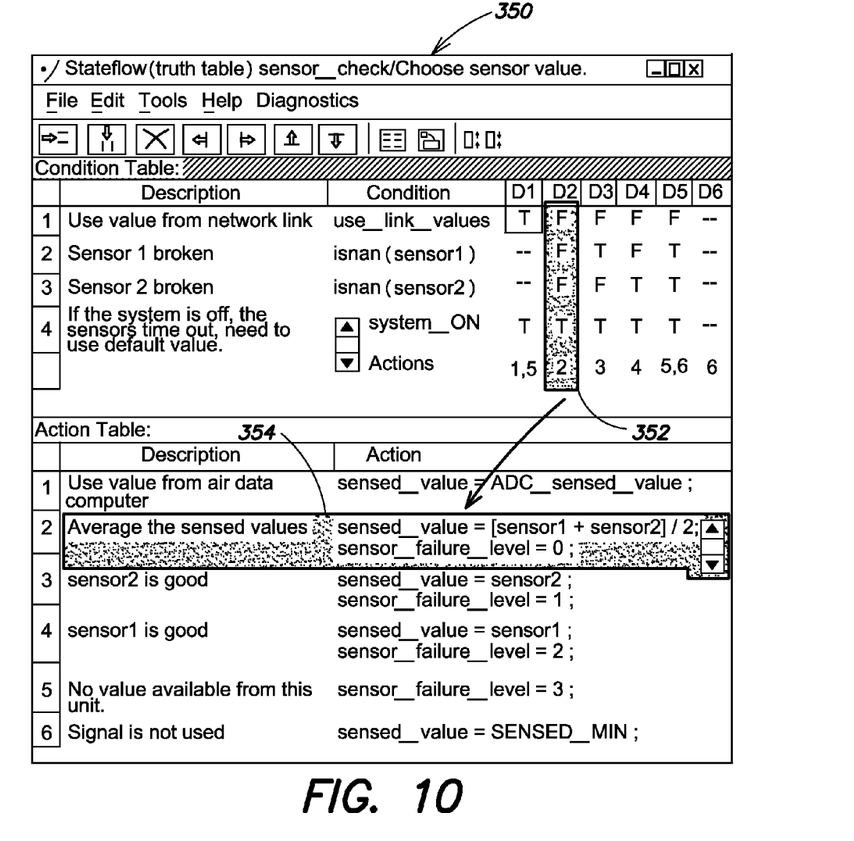
FIG. 10 is a GUI illustrating action highlighting.

Referring now to FIG. 10, a GUI 350 illustrates action highlighting of a current decision set and action(s). During simulation with action highlighting enabled or during debug execution, the active decision set 352 and action(s) 354 are highlighted with a graphical indication of the active decision set and action(s) executing. In this GUI 350 the highlighting is active for both the active decision set 352 and the action 354 to show the decision set coming "on," then turning "off" as the execution proceeds into the corresponding action. In other examples different highlighting can be shown that reflects different situations. In one example, a "one on at a time" mode is used that turns on the decision set, then turns the decision set off before the first action, then turns on the first action, then turns the first action off before the next action, and so forth.

In another example, a "temporary trace path" mode turns on the decision set, then changes the decision set's color to "was run", then illuminates the first action, then changes the first action's color to "was run", then illuminates the next action (if any), and so forth. So before ending execution, the user 34 can see an entire path through the truth table. Upon exiting the truth table, all highlighting is turned off.

In still another example, a "coverage trace path" mode resembles the temporary trace mode described above, except that the illumination is persistent for the entire debug session. There are three highlights used: "current", "was run on this execution", and "was run at least once during this session".

The debugging process 120 of the statechart process 22 is integrated into the model environment. The debugging process 120 can debug a hierarchical model containing Simulink® blocks, Stateflow® charts, TMW truth tables, and M code or other textual languages.

Figure 11:
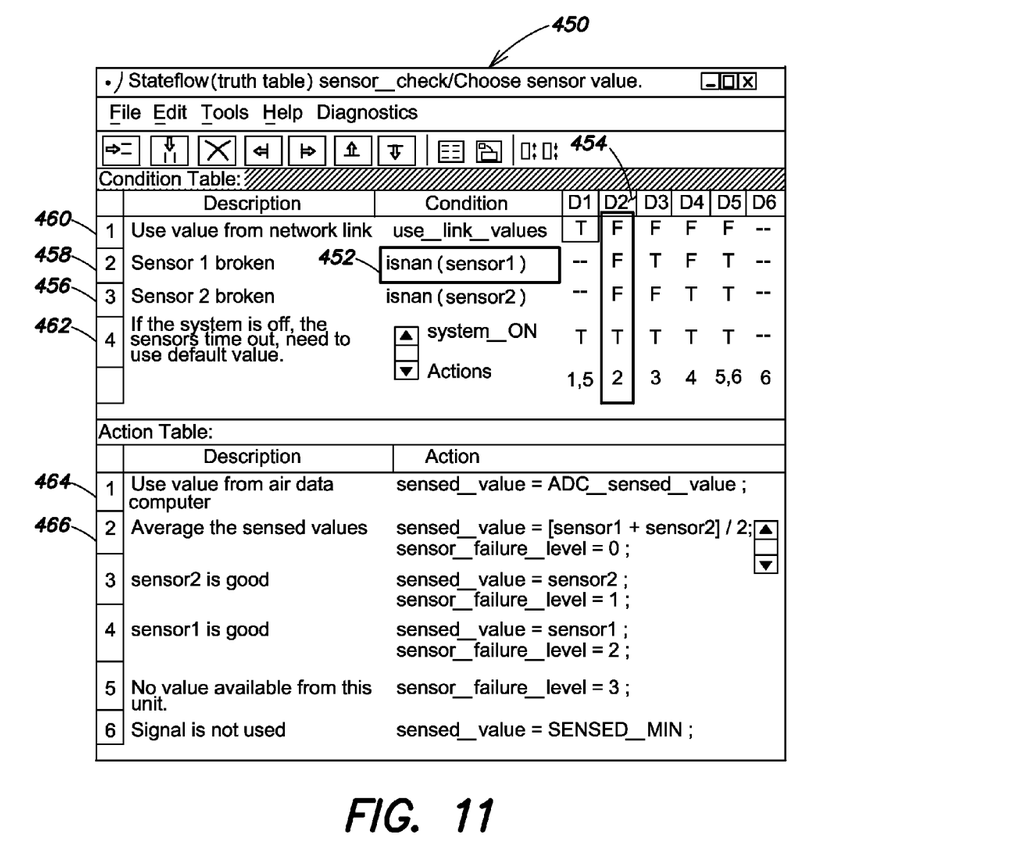
FIG. 11 is a debugging GUI.

Referring to FIG. 11, the debugging process 120 displays a debugging GUI 450. The user 34 selects a condition row, decision set column, or action row and sets a breakpoint at it by selecting a "set breakpoint" button on the GUI 450. Whenever execution of the truth table causes the item to execute (condition, decision set, or action), then execution of the simulation or generated code halts and the truth table editor is brought to the foreground with the breakpointed item highlighted, along with other active elements.

In an example, a breakpoint on condition 2 (452) has been encountered when condition set D2 (454) became active D2(454) is pending in progress until the debugging session continues by single stepping to condition 3 (456) (which in the process causes condition 2 (452) to be evaluated, then the debugger highlights condition 3 (456) and halts again) or pressing "continue" on the debugger.

Decision set 2 (454) is shown highlightened to indicate a computation in progress but the actual debugger breakpoint (denoted with a should item) is at a condition within the hierarchy of decision set 2 (454), condition 2 (458) in this instance. While the debugging process 120 evaluates the entire condition at once, other features to debugging can be implemented to instrument the individual operations of a compound Boolean expression in the condition.

"Don't care" items are skipped in the condition sequence, so if conditions 1 (460) and 4 (462) were true and the debugger stopped at condition 1 (460) (via a breakpoint or single step or any global breakpoint condition (such as inf/nan detection or zero crossing detection), then a single step debugger command would make the debugger jump to condition 4 (462), bypassing the two "don't care" conditions. Once all the conditions are executed and the evaluation of decisions set 2 (454) is complete, the debugger would advance to action 2 (466).

When execution is stopped at any point, persistent values available in the data dictionary can be examined using a Stateflow® value inspector. For local values, the truth table must be in the current context, i.e., the debugger must be halted on a breakpoint somewhere within the truth table conditions, logic table, or actions.

In the case of graphical conditions or actions (such as a Simulink® function call subsystem or Stateflow® graphical function), the debugging process 120 is able to stop at breakpoints set within the conditions and actions.

Other embodiments are within the scope of the following claims.

What is claimed is:

1. A computer-implemented method, comprising:
   accessing, using a processor of a computer, a statechart, wherein the statechart:
   is in a block diagram model of a system,
   models a finite state machine, and
   includes an action language:
   graphically defining a truth table graphical function in the statechart in the block diagram model of the system, the graphically defining comprising:
   generating a visual representation of the truth table graphical function in the statechart,
   generating a truth table in the statechart, the truth table implementing one or more logical decisions in a textual truth table form,
   receiving a selection of the visual representation of the truth table graphical function,
   opening an editor in response to the receiving of the selection of the visual representation,
   defining the one or more logical decisions implemented by the truth table using the editor, the defining comprising:
   adding a condition to the truth table using the editor, the condition specifying at least one evaluatable parameter,
   adding a decision set to the truth table using the editor, the decision set comprising:
   an evaluation of the at least one evaluatable parameter specified in the condition, and
   adding an action to the truth table using the editor, the action:
   identifying a command to be executed based on the evaluation of the at least one evaluatable parameter, and
   being written in the action language of the statechart; and
   simulating the statechart and the block diagram model, the simulating comprising:
   invoking the truth table graphical function in the statechart,
   executing the truth table graphical function based on the invoking,
   evaluating the truth table with the truth table graphical function by performing the evaluation of the at least one evaluatable parameter to generate a decision result,
   comparing the decision result to the decision set,
   determining whether the decision result matches the decision set based on the comparing, and
   performing the action when the decision result matches the decision set.

2. The method of claim 1, wherein:
the graphically defining comprises naming the truth table graphical function, and
the truth table graphical function is invoked by name.

3. The method of claim 1, further comprising generating programming code for the truth table graphical function.

4. The method of claim 1, further comprising displaying a flow visualization of the truth table graphical function on a display device along with a visualization of the statechart.

5. The method of claim 1, wherein the block diagram model is a time-based block diagram model.

6. A non-transitory storage medium storing computer-executable instructions, the instructions comprising:
   one or more instructions that, when executed by a processor, cause the processor to:
   accessing, using the processor, a statechart in a block diagram model of a system, wherein the statechart models a finite state machine;
   graphically defining a truth table graphical function in the statechart, the graphically defining comprising:
   generating a visual representation of the truth table graphical function in the statechart,
   generating a truth table in the statechart, the truth table implementing one or more logical decisions in a textual truth table form,
   receiving a selection of the visual representation of the truth table graphical function,
   opening an editor in response to the receiving of the selection of the visual representation,
   defining the one or more logical decisions implemented by the truth table using the editor, the defining comprising:
   adding a condition to the truth table using the editor, the condition specifying at least one evaluatable parameter, adding a decision set to the truth table using the editor, the decision set comprising an evaluation of the at least one evaluatable parameter specified in the condition, and adding an action to the truth table using the editor, the action:

identifying a command to be executed based on the evaluation of the at least one evaluatable parameter, and being written in an action language of the statechart; and simulating the statechart and the block diagram model, the simulating comprising:

invoking the truth table graphical function in the statechart so that the truth table graphical function executes, evaluating the truth table with the truth table graphical function by performing the evaluation of the at least one evaluatable parameter to generate a decision result, comparing the decision result to the decision set to determine if the decision result matches the decision set, and performing the action when the decision result matches the decision set.

7. The storage medium of claim 6, wherein the truth table graphical function is invoked by name.

8. The storage medium of claim 6, further storing instructions for generating programming code for the truth table graphical function.

9. The storage medium of claim 6, further storing instructions for displaying a flow visualization of the truth table graphical function on a display device along with a visualization of the statechart.

10. A computer system, comprising:

a processor configured to:

access a statechart in a block diagram model of a system, wherein the statechart models a finite state machine;

graphically define a truth table graphical function in the statechart, the graphically defining comprising:

generating a visual representation of the truth table graphical function in the statechart, generating a truth table in the statechart, the truth table implementing one or more logical decisions in a textual truth table form, receiving a selection of the visual representation of the truth table graphical function, opening an editor in response to the receiving of the selection of the visual representation, defining the one or more logical decisions implemented by the truth table using the editor, the defining comprising:

adding a condition to the truth table using the editor, the condition specifying at least one evaluatable parameter, adding a decision set to the truth table using the editor, the decision set comprising an evaluation of the at least one evaluatable parameter specified in the condition, and adding an action to the truth table using the editor, the action:

identifying a command to be executed based on the evaluation of the at least one evaluatable parameter, and being written in an action language of the statechart; and simulate the statechart and the block diagram model, the simulating comprising:

invoking the truth table graphical function in the statechart so that the truth table graphical function executes, evaluating the truth table with the truth table graphical function by performing the evaluation of the at least one evaluatable parameter to generate a decision result, comparing the decision result to the decision set to determine if the decision result matches the decision set, and performing the action when the decision result matches the decision set.

* * * * *